United States Patent [19]

Burdick

[11] 4,020,424
[45] Apr. 26, 1977

[54] ACTIVE DIFFERENTIAL FILTER NETWORK

[76] Inventor: Neal M. Burdick, 6371 Celia Vista Drive, San Diego, Calif. 92115

[22] Filed: Oct. 20, 1975

[21] Appl. No.: 623,915

Related U.S. Application Data

[63] Continuation-in-part of Ser. No. 421,025, Dec. 3, 1973, Pat. No. 3,914,701, which is a continuation-in-part of Ser. No. 294,380, Dec. 2, 1972, Pat. No. 3,818,341.

[52] U.S. Cl. .............................. 328/167; 330/146
[51] Int. Cl.² ....................................... H04B 15/00
[58] Field of Search ................. 330/107, 109, 146; 328/167; 307/233; 323/75 N; 324/DIG. 1

[56] References Cited
UNITED STATES PATENTS

| | | | |
|---|---|---|---|
| 3,344,283 | 9/1967 | Stubbs | 330/109 |
| 3,588,728 | 6/1971 | Elazar | 330/146 |
| 3,596,198 | 7/1971 | Niki et al. | 330/146 |
| 3,638,133 | 1/1972 | Meyers | 330/146 |
| 3,747,009 | 7/1973 | Funke | 330/146 |

*Primary Examiner*—Stanley D. Miller, Jr.
*Attorney, Agent, or Firm*—Dunlap, Codding & McCarthy

[57] ABSTRACT

The present invention contemplates an improved active differential filter network comprised of a bridge network having a pair of input-output junctions and a pair of control junctions, and an operational amplifier having an inverting input connected to one of the control junctions and an output connected to the other control junction, the operational amplifier having a non-inverting input connected to a bias control signal.

3 Claims, 2 Drawing Figures

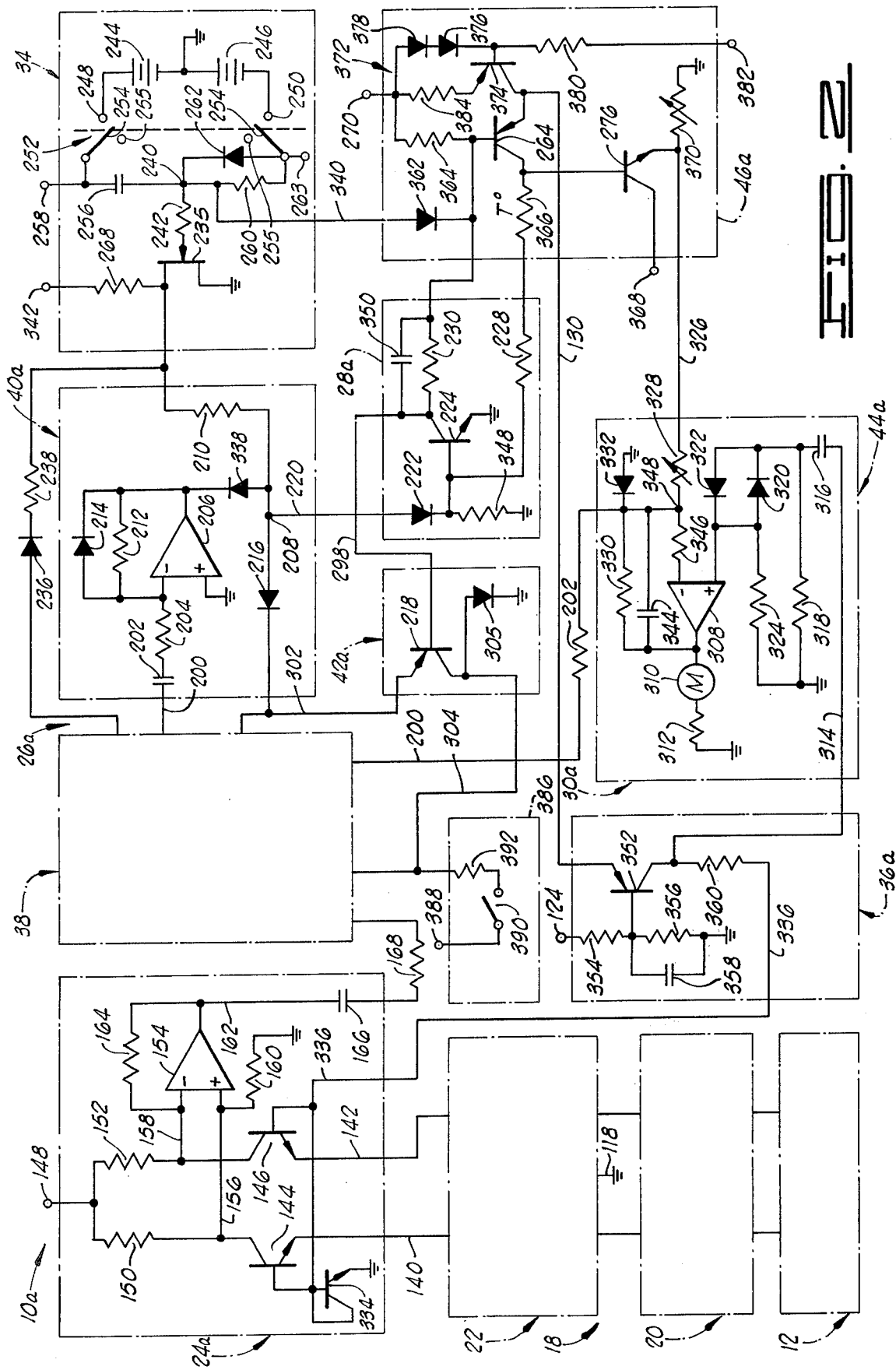

ACTIVE DIFFERENTIAL FILTER NETWORK

CROSS-REFERENCE TO RELATED APPLICATIONS

The present application is a continuation-in-part of the Applicant's copending application entitled "Indicator Apparatus for Developing Output Indications Indicative of Input Signals", Ser. No. 421,025, filed on Dec. 3, 1973, now U.S. Pat. No. 3,914,701 which was a continuation-in-part of the Applicant's then copending application entitled "Apparatus for Providing Output Indications Responsive to the Movement of a Moving Body", Ser. No. 294,380, filed on Dec. 2, 1972, now U.S. Pat. No. 3,818,341.

BACKGROUND OF THE INVENTION

This invention relates generally to improvements in active differential filter networks and, more particularly, but not by way of limitation, to an improved active differential filter network comprised of a bridge network and an operational amplifier.

SUMMARY OF THE INVENTION

An object of the invention is to provide an improved active differential filter network comprised of a bridge network and an operational amplifier.

Other objects and advantages of the invention will be evident from the following detailed description when read in conjunction with the accompanying drawings which illustrate the various embodiments of the invention.

BRIEF DESCRIPTION OF THE DRAWINGS

FIG. 1 is a schematic, diagrammatic view of the active differential filter network of the present invention in one operating environment.

FIG. 2 is a partial, diagrammatic schematic view of a modified active differential filter network in one other operating environment.

DESCRIPTION OF THE PREFERRED EMBODIMENT

Figure 1:
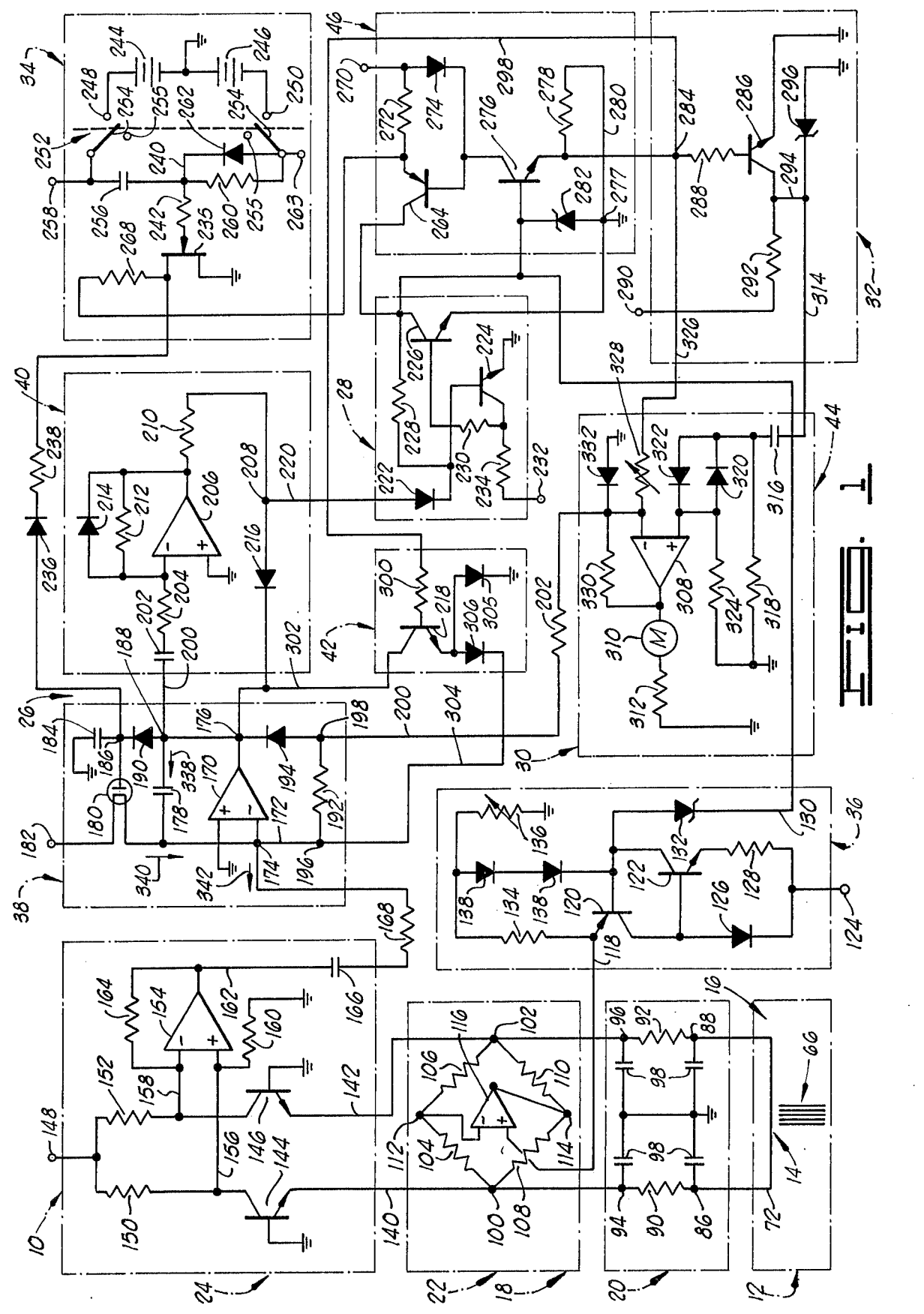

Referring to the drawings in general, and to FIG. 1 in particular, shown therein and designated by the general reference numeral 10 is an indicator apparatus providing a convenient, economical, efficient and, in one form, portable apparatus for sensing a parameter, condition, status or the like and providing an output indication indicative of the sensed parameter, condition, status or the like. The indicator apparatus 10 is particularly suitable for indicating the velocity of a moving object such as a golf club, a golf ball or the like, for example, and one embodiment of the present invention adapted for indicating the velocity of a moving object was disclosed in detail in the Applicant's copending application entitled "Indicator Apparatus for Developing Output Indications Indicative of Input Signals", Ser. No. 421,025, filed on Dec. 3, 1973, which was a continuation-in-part of the Applicant's then copending application entitled "Apparatus for Providing Output Indications Responsive to the Movement of a Moving Body", Ser. No. 294,380, filed on Dec. 2, 1972, now U.S. Pat. No. 3,818,341.

As shown in FIG. 1, the indicator apparatus 10 includes a transducer 12 having a sensor 14 constructed and positioned to sense the parameter to be measured or indicated and, in one form, a signal transducer 16 connected to the sensor 14 generating an input electrical signal responsive to and indicative of the parameter sensed by the sensor 14, or in a preferred embodiment, the velocity of the moving object striking the sensor 14. The input signal produced via the transducer 12 is connected to a filter network 18, including a low pass filter network 20 and an active differential filter network 22 constructed in accordance with the preferred embodiment of the present invention, and to an amplifier network 24, the filtered and amplified input signal from the amplifier network 24 being connected to a delay and sample network 26.

In general, the delay and sample network 26 is constructed to receive the input signal generated via the transducer 12, to sense that a portion of the transducer 12 has been moved a predetermined distance or, more particularly, to sense the integral of the input signal and to develop a sample signal and a trigger signal in response to a sensed integrated input signal of a predetermined minimum value. The developed sample signal is held via the indicator apparatus 10 and the developed trigger signal is utilized to indicate that the sample signal has been developed via the delay and sample network 26, in a manner and for reasons to be described in greater detail below.

Referring more specifically to the indicator apparatus 10 constructed to provide an output indication indicative of the velocity of a moving object, the delay and sample network 26 receives the input signal generated via the transducer 12 and senses that a portion of the transducer 12 has been moved a predetermined distance via the moving object, the delay and sample network 26 sensing the integral of the input signal and developing a sample signal indicative of the velocity of the moving object in response to a sensed integrated input signal shift from an initial predetermined value to a predetermined minimum value. In this embodiment of the invention, the trigger signal generated via the delay and sample network 26 indicates that a sample signal proportional to the input signal and indicative of the velocity of the moving object has been developed via the delay and sample network 26. The developed sample signal is held in the indicator apparatus 10 until the indicator apparatus 10 has been reset to receive subsequent input signals and develop subsequent samples in response thereto in a manner generally described before. The trigger signal from the delay and sample network 26 is connected to and received by a control signal generator 28 which is constructed to generate or produce a control signal in response to the received trigger signal.

The indicator apparatus 10 is, in one preferred form, constructed to be positioned in what is sometimes referred to herein as a "sampled position" wherein the various components and assemblies are positioned to substantially prevent or block subsequent sampling of input signals induced therein via the transducer 12 after the initiation of the control signal or, in other words, after the delay and sample network 26 has sensed an integrated input signal of a predetermined value. The indicator apparatus 10 remains in the "sampled position" until reset for receiving, sampling and indicating subsequently induced input signals, in a manner and for reasons to be made apparent below.

The sample signal proportional to the input signal developed in the delay and sample network 26 is connected to an output indicator 30. The output indicator 30 is connected to the delay and sample network 26 and to the control signal generator 28, the output indicator 30 being constructed to provide an operator-perceivable output indication indicative of the sample signal in response to the received sample signal from the delay and sample network 26. The output indicator 30 also provides output indications indicating the development of the sample signal and indicating the resetting of the indicator apparatus 10 for receiving subsequently induced input signals in a manner to be described in greater detail below. The operator-perceivable output indications of the output indicator 30 can take the form of a digital type read-out, a recording on a chart or the like, a meter needle position relative to a meter scale or, in one preferred form, a dial indication of a null type meter or various combinations of the mentioned indications, the last-mentioned form of output indication being shown in FIG. 1 and being described in greater detail below.

In one preferred embodiment, shown in FIG. 1, the indicator apparatus 10 and, more particularly, the output indicator 30 includes a sample indicator 32 having a portion connected to the control signal generator 28 receiving the control signal therefrom and cooperating to provide operator-perceivable output indications indicative that the indicator apparatus 10 has been turned-on and reset, or that the sample signal has been developed and the indicator apparatus 10 has been positioned to provide additional operator-perceivable output indications via the output indicator 30 indicative of the input signal. The operator-perceivable output indication produced via the sample indicator 32 can take the form of a light indicator such as via a light emitting diode or the like when indicating that the indicator apparatus 10 has been turned on and reset or that the sample signal has been developed, or via a meter needle position or movement or the like, or via a light and digital read-out, for example. The indicator apparatus 10, as shown in FIG. 1, more particularly, utilizes a meter and the meter-needle swing to provide some of the last-mentioned output indications in a manner to be described in greater detail below.

A reset network 34 is connected to the indicator apparatus 10 for positioning the various components and assemblies to receive and provide output indications of subsequently induced input signals, in a manner to be described in greater detail below.

In one preferred embodiment, as shown in FIG. 1, the amplifier network 24 is biased via a bias control 36 in an activated position of the bias control 36, the bias control 36 being connected to the amplifier network 24 via the active differential filter network 22. The bias control 36 is connected to the control signal generator 28 and receives the control signal therefrom, the amplifier network 24 being deactivated in response to the received control signal.

As schematically shown in FIG. 1, the delay and sample network 26, more particularly, includes a peak detector 38, a trigger signal generator 40 and a hold network 42. The output indicator 30, more particularly, includes the sample indicator 32, a meter network 44 and a reference network 46.

The peak detector 38 is connected to the trigger signal generator 40, a portion of the peak detector 38 developing the sample signal and providing a signal connected to the trigger signal generator 40 for generating the trigger signal in response to the development of the sample signal. More particularly, the peak detector 38 is constructed to delay the developing of the sample signal until the integral of the input signal shifts from an initial predetermined level to a second, predetermined level or, in other words, until the integral of the input signal reaches a predetermined minimum level thereby substantially preventing the premature sampling of the input signal induced via the transducer 12. The predetermined level of the integrated input signal initiating the trigger signal and the control signal is, in a preferred form, of a magnitude and delayed a period of time sufficient to prevent the premature sampling of the sample signal for substantially assuring the sample signal developed in response to the input signal induced in the indicator apparatus 10 via the transducer 12 is indicative of the desired parameter such as the velocity of the moving object, for example, in a manner and for reasons to be described in greater detail below.

The voltage proportional to or indicative of the velocity of the moving object or, in other words, the sample signal developed in the peak detector 38 is connected to the meter network 44, the meter network 44 receiving the sample signal and providing the operator-perceivable output indication indicative of the input signal. The meter network 44 is connected to the reference network 46, and the reference network 46 is connected to the control signal generator 28 for receiving the control signal therefrom. The reference network 46 is constructed to develop a predetermined voltage reference signal (sometimes referred to herein simply as a "reference signal") in response to the received control signal, the reference signal being connected to the meter network 44 for reasons and in a manner to be made more apparent below.

The hold network 42 is connected to the peak detector 38 and connected to the control signal generator 28 via the reference network 46, the hold network 42 receiving the reference signal from the reference network 46 generated or produced in response to a received control signal and being activated in response thereto. The hold network 42 essentially prevents further sampling of subsequently induced input signals until the various components and assemblies are reset via the reset network 34.

In summary, the indicator apparatus 10 develops a sample signal proportional to and indicative of the input signal and in response to a received, input signal induced therein via the transducer 12 when the integral of the input signal reaches a predetermined minimum level, the meter network 44 receiving the developed sample signal from a portion of the peak detector 38 and providing an operator-perceivable output indication indicative of the input signal in response to the received sample signal. In one embodiment disclosed in detail in the Applicant's copending application entitled "Indicator Apparatus for Developing Output Indications Indicative of Input Signals", Ser. No. 421,025, filed on Dec. 3, 1973, which was a continuation-in-part of the Applicant's then copending application entitled "filter network for Providing Output Indications Responsive to the Movement of a Moving Body", Ser. No. 294,380, filed on Dec. 2, 1972, now U.S. Pat. No. 3,818,341, the transducer 12 includes a magnet 66, schematically shown in FIG. 1.

Referring more particularly to the control circuit of the indicator apparatus 10, shown in FIG. 1 and generally described before, a wire loop 72 is schematically represented as an electrical short connected across the input terminals 86 and 88 of the low pass filter network 20, the construction of the wire loop 72 and the control circuit connecting the induced input signal to the control circuit such that the polarity of the induced input signal voltage is positive at the terminal 88 and negative at the terminal 86, the wire loop 72 and the operation of the loop 72 to induce the input signal being described in detail in the Applicant's copending application entitles "Indicator Apparatus for Developing Output Indications Indicative of Input Signals", Ser. No. 421,025, filed on Dec. 3, 1973, which was a continuation-in-part of the Applicant's then copending application entitled "Apparatus for Providing Output Indications Responsive to the Movement of a Moving Body", Ser. No. 294,380, filed on Dec. 2, 1972, now U.S. Pat. No. 3,818,341. The low pass filternetwork 20 includes a pair of resistors 90 and 92, the resistor 90 being connected to the input junction 86 and the resistor 92 being connected to the input junction 88. The resistor 90 is also connected to an output junction 94 and the resistor 92 is also connected to an output junction 96. The low pass filter network 20 also includes four capacitors 98, each capacitor 98 being connected to one of the junctions 86, 88, 94 and 96, the sides of the capacitors 98, opposite the sides connected to the junctions, being connected to a common ground. In one operational embodiment, the low pass filter network 20 and the various components thereof are constructed and sized to attenuate input signals thereto have a frequency exceeding approximately $10^4$Hz, the low pass filter network 20 passing input signals thereto having frequencies generally below approximately $10^4$Hz.

The output of the low pass filter network 20 at the output junctions 94 and 96 is connected to the junctions 100 and 102 of the active differential filter network 22. The active differential filter network 22 includes four impedance devices or, more particularly, four resistors 104, 106, 108 and 110 connected in a bridge network type of arrangement wherein the resistors 104 and 108 are each connected to the junctions 100, the resistors 106 and 110 are each connected to the junction 102, the resistors 104 and 106 are each connected to a junction 112, and the resistors 108 and 110 are each connected to a junction 114. The resistors 104 and 106 have substantially the same resistance value and the resistors 108 and 110 have substantially the same resistance value. The junctions 100 and 102 provide the common input junctions and output junctions of the active differential filter network 22 (the junctions being sometimes referred to below as the "input-output junctions 100 and 102"), the junction 112 being connected to the negative or inverting input of an operational amplifier 116, and the junction 114 being connected to the ouput of the operational amplifier 116. The positive or noninverting input of the operational amplifier 116 is connected via a conductor 118 to the bias control 36, which is constructed to provide a constant operating bias for the differential amplifier network comprising a portion of the amplifier network 24, in a manner to be described in greater detail below.

The active differential filter network 22 operates to maintain the sum of the voltage levels at the junctions 100 and 102 substantially constant or, in other words, to substantially maintain the sum of the voltages at a predetermined level controlled via the bias voltage input to the noninverting input of the operational amplifier 116 from the bias control 36, thereby effectively cancelling or providing a relatively low impedance to common mode signals. The active differential filter network 22 provides a relatively high input impedance with respect to differential input signals connected to the input-output junctions 100 and 102, thereby essentially providing an open circuit with respect to input differential signals. The operational amplifier 116 operates to substantially maintain the inverting input at substantially the same voltage level as the noninverting input, the output of the operational amplifier 116 tending to maintain the common mode voltage at the input-output terminals 100 and 102 relatively constant.

Referring more particularly to the bias control 36, a negative power supply is connected to a terminal 124, the terminal 124 being connected to a silicon type of diode 126 and to the emitter of a germanium type transistor amplifier 122 via a resistor 128, the collector of the transistor amplifier 122 being connected to the control signal generator 28 via a conductor 120 and to the base of the transistor amplifier 120. A zener type of diode 132 is interposed in the conductor 130, generally between the connection between the collector of the transistor amplifier 122 and the base of the transistor amplifier 120 and the conductor 130. Thus, when a positive control signal is generated via the control signal generator 28, that positive control signal is applied to the base of the transistor amplifier 120 via the diode 132 which reduces the base-emitter voltage of the transistor amplifier 120 to substantially zero thereby switching the transistor amplifier 120 "off" or non-conducting. In this position of the transistor amplifier 120, the voltage on the conductor 118 is substantially zero thereby connecting a substantially zero common mode or bias voltage to the amplifier network 24 deactivating the amplifier network 24.

The emitter of the transistor amplifier 120 is connected to ground via a resistor 134 and a variable resistor 136, a pair of diodes 138 are connected between the resistor 134 and the variable resistor 136 and to the base of the transistor amplifier 120, generally between the transistor amplifier 120 and the connection of the base thereof to the collector of the transistor amplifier 122, as shown in FIG. 1. Thus, within defined limits, the variable resistor 136 adjustingly controls the level of the output voltage of the bias control 36 at the conductor 118, thereby controlling the voltage supplied to the operational amplifier 116 of the active differential filter network 22 and providing an adjustable bias voltage or signal control for the amplifier network 24 via the bias control 36.

The output of the active differential filter network 22 at the input-output junctions 100 and 102 is connected to the amplifier network 24 via a pair of conductors 140 and 142. More particularly, the conductor 140 is connected to the emitter of a transistor amplifier 144 and the conductor 142 is connected to the emitter of a transistor amplifier 146, the base of each of the transistor amplifiers 144 and 146 being connected to ground. The collector of each of the transistor amplifiers 144 and 146 is connected to a positive power supply at the terminal 148, the collector of the transistor amplifier 144 being connected at the terminal 148 via a resistor 150 and the collector of the transistor amplifier 146 being connected to the terminal 148 via a resistor 152.

The two transistor amplifiers 144 and 146 are thus connected to receive and amplify the active differential filter network 22 output signal and generally comprise an emitter coupled common base type of amplifier network, the bias control 36 being connected to the transistor amplifiers 144 and 146 providing the bias voltage therefor during the operation of the indicator apparatus 10 and in an activated position of the bias control 36. The signal amplified via the transistor amplifier 144 is connected to the positive input of an operational amplifier 154 via a conductor 156, connected generally between the collector of the transistor amplifier 144 and the resistor 150, and the signal amplified via the transistor amplifier 146 is connected to the negative input of the operational amplifier 154 via a conductor 158, connected between the collector of the transistor amplifier 146 and the resistor 152.

A resistor 160 is connected to ground and to the positive input of the operational amplifier 154 via the conductor 156, as shown in FIG. 1. The output signal of the operational amplifier 154 is connected to the peak detector 38 via a conductor 162, a feedback resistor 164 being connected between the operational amplifier 154 output signal on the conductor 162 and the negative input thereto. The transistor amplifiers 144 and 146 and the operational amplifier 154 are, more particularly, connected to comprise what may be referred to as an emitter coupled, common base differential type of amplifier network.

A capacitor 166 and a resistor 168 are interposed in the conductor 162, the capacitor 166 blocking the D-C component of the output signal of the operational amplifier 154. The conductor 162 is, more particularly, connected to a conductor 172 at a junction 174, the junction 174 being connected to the negative input of the operational amplifier 170. The positive input of the operational amplifier 170 is connected to ground, as shown in FIG. 1.

The output of the operational amplifier 170 in the peak detector 38 is connected to a junction 176, and an integrator capacitor 178 is connected between the operational amplifier 170 output signal at the junction 176 and the negative input to the operational amplifier 170 at the junction 174, the integrator capacitor 178 being connected to and cooperating with the operational amplifier 170 such that the operational amplifier 170 and the integrator capacitor 178 function in the nature of an integrating network during one portion of the operation of the indicator apparatus 10, as generally described in greater detail below.

The peak detector 38 also includes a switch 180 connected to a positive power supply at a junction 182 and to the negative input of the operational amplifier 170 or, more particularly, to the junction 174, the switch 180 being more particularly of the type referred to in the art as a "MOS field-effect transistor switch" designed for enhancement-mode operation in relatively low power switching applications, for example. The integrator capacitor 178 is connected to the switch 180, generally between the switch 180 and the junction 174. The switch 180 is connected to a sample capacitor 184 at a junction 186, the side of the sample capacitor 184, opposite the side connected to the junction 186 being connected to ground. The junction 186 is connected to one side of the integrator capacitor 178 at a junction 188, generally between the integrator capacitor 178 and the output of the operational amplifier 170 or, in other words, generally between the integrator capacitor 178 and the junction 176. A diode 190 is interposed between the junction 186 and the junction 188, the cathode end of the diode being connected to the junction 186 thereby preventing the discharge of the sample capacitor 184 therethrough, for reasons which will be made more apparent below.

A sample resistor 192 is connected to the conductor 172 and to the negative input of the operational amplifier 170 at the junction 174, the sample resistor 192 also being connected to the output of the operational amplifier 170 at the junction 176 and a diode 194 being interposed between the resistor 192 and the junction 176. The sample resistor 192 is thus connected between the input and the output of the operational amplifier 170 at a pair of junctions 196 and 198, and is connected to the positive power supply 182 via the switch 180, as shown in FIG. 1. The junction 198 is connected to the meter network 44 via a conductor 200 and a resistor 202 is interposed in the conductor 200, generally between the junction 198 and the meter network 44. Thus, the meter network 44 is connected to the peak detector 38 to measure and provide an operator-perceivable output indication of the voltage drop across the sample resistor 192, the voltage drop across the sample resistor 192 being indicative of and proportional to the input signal.

During the operation of the indicator apparatus 10, the output signal from the operational amplifier 170 of the peak detector 38 at the junction 176 is initially at a first level which is "low", the output of the operational amplifier 170, in one operative embodiment, being a negative voltage value of (—)0.7 volts, for example. This initial "low" output signal of the operational amplifier 170 is primarily due to the continuous sampling of relatively low level "noise" during the resetting of the indicator apparatus 10, the sample capacitor 184 having some relatively low charge thereon. When the input signal is induced in the control circuit of the indicator apparatus 10 via the transducer 12 and amplified via the amplifier network 24, the amplified input signal is connected to the operational amplifier 170 causing the operational amplifier 170 output signal at the junction 176 to swing in a positive direction, the operational amplifier 170 and the capacitor 178 connected in parallel with the input and the output of the operational amplifier 170 functioning as an integrating network to integrate the input signal received via the operational amplifier 170. The positive swing integrated input signal at the output junction 176 of the operational amplifier 170 charges the integrator capacitor 178 and, when the voltage level of the integrated input signal at the junction 176 reaches a predetermined minimum level, the diode 190 is forward biased and the sample capacitor 184 begins to charge. The integrator capacitor 178 is, more particularly, sized to have a predetermined charging time; that is, a predetermined period of time is required to charge the integrator capacitor 178, for reasons and in a manner to be described in greater detail below with respect to the operation of the indicator apparatus 10.

The peak detector 38 is, more particularly, connected to the trigger signal generator 40 via a conductor 200, having a capacitor 202 and a resistor 204 interposed therein, the conductor 200 being more particularly connected to the junction 188 and to the negative input of an operational amplifier 206. The positive input to the operational amplifier 206 is connected to ground, and the output signal of the operational amplifier 206 is connected to a junction 208 via a resistor 210. A feedback loop is connected between the output of the operational amplifier 206 and the negative input to the operational amplifier 206, the feedback loop comprising a feedback resistor 212 and a diode 214, the diode 214 being connected in parallel with the feedback resistor 212.

The junction 208, connected to the output of the operational amplifier 206, is connected to the junction 176 of the peak detector 38 via a diode 216, the common connection between the junction 176 and the diode 216 being connected to a collector of a transistor amplifier 218 in the hold network 42. The junction 208, generally between the diode 216 and the resistor 210, is also connected to the control signal generator 28 via a conductor 220, a diode 222 being interposed in the conductor 220.

The operational amplifier 206 is thus connected to the various components of the trigger signal generator 40 to operate and function in the nature of a logarithmic differentiator, the differentiator network receiving the integrated input signal from the peak detector 38 via the connection between the inverting input of the operational amplifier 206 and the junction 188 of the peak detector 38 and producing an output signal responsive to the negative value of the rate-of-change of the integrated input signal with respect to time. The diode 222 is sized to be forward biased conducting the trigger signal generator 40 output signal or, more particularly, the trigger signal to the control signal generator 28 at a predetermined "high" level of the differentiator output signal connected to the junction 208 and the diode 216 is sized to not clamp the differentiator output signal at the junction 208 at a predetermined "high" level of the integrated input signal at the junction 176. Thus, the diodes 216 and 222 and the resistor 210 comprise what may generally be referred to as a "logical AND circuit" constructed such that the signal at the junction 176 of the peak detector 38 and the signal at the junction 208 of the trigger signal generator 40 must each be at a predetermined "high" level before the trigger signal is generated and produced by the trigger signal generator 40 and connected to the control signal generator 28 via the diode 222. The produced and generated trigger signal of the trigger signal generator 40 is thus indicative of the development of the sample signal in the peak detector 38, in a manner and for reasons to be made more apparent below.

The control signal generator 28 basically comprises a pair of transistor amplifiers 224 and 226, schematically shown in FIG. 1. The trigger signal from the trigger signal generator 40 is connected to the base of the transistor amplifier 224 via the conductor 220 and the diode 222 in a forward biased position of the diode 222, the base of the transistor amplifier 224, generally between the diode 222 and the transistor amplifier 224, being connected to the collector of the transistor amplifier 226 via a resistor 228, and the base of the transistor amplifier 226 being connected to the collector of the transistor amplifier 224 via a resistor 230. The emitter of the transistor amplifier 224 is connected to ground, and the collector of the transistor amplifier 224 is connected to a positive power supply at a terminal 232 via a resistor 234, the resistor 234 being interposed between the connection between the base of the transistor amplifier 226 to the collector of the transistor amplifier 224 and the positive power supply connected at the terminal 232. The transistor amplifiers 224 and 226 are thus interconnected to comprise what is commonly referred to in the art as a "flip-flop" circuit wherein the transistor amplifier 226 is initially biased in the conducting or "on" position and the transistor amplifier 224 is initially biased in the non-conducting or "off" position, the status of the transistor amplifiers 224 and 226 being reversed in response to a received trigger signal from the trigger signal generator 40, the control signal generator 28 thus producing the control signal in response to a received, positive trigger signal, as mentioned before and for reasons which will be made more apparent below.

The peak detector 38 is connected to the reset network 34 and, more particularly, the junction 186 between the capacitor 184 and the switch 180 is connected to a switch 235, the switch 235 being, more particularly, a field effect type of transistor (FET) and the junction 186 being, more particularly, connected to the source connection of the switch 235 via a diode 236 and a resistor 238. The drain side of the switch 235 is connected to ground, as shown in FIG. 1. The gate of the switch 235 is connected to a junction 240 via a resistor 242.

The reset network 34 includes a pair of electrical power supplies 244 and 246, the negative side of the power supply 244 being connected to the positive side of the power supply 246 and the common connection therebetween being connected to ground, as shown in FIG. 1. The power supply 244 is connected to a switch position 248 and the power supply 246 is connected to a switch position 250, the switch positions 248 and 250 constituting the reset and on switch positions of a double-pole, single throw switch 252 having a pair of mechanically connected switch arms 254, as shown in FIG. 1. The switch 252 also includes a pair of "off" switch positions, each designated by the reference numeral 255 in FIG. 1.

One of the switch arms 254 of the switch 252 is connected to the terminal 240 via a capacitor 256, the connection between the switch arm 254 and the capacitor 256 being connected to the positive buss for the indicator apparatus 10 at a terminal 258 and the other switch arm 254 of the switch 252 being connected to the terminal 240 via a resistor 260 and a diode 262 connected in parallel and to the negative buss for the indicator apparatus 10 at a terminal 263. In the "off" position of the switch 252, the switch arms 254 are each positioned to interrupt the electrical continuity between the electrical power supplies 244 and 246 and the components and assemblies of the indicator apparatus 10 connected thereto and, in the reset or on position of the switch arms 254, electrical continuity is established between the electrical power supplies 244 and 246 and the various components and assemblies of the indicator apparatus 10, in a manner to be described in greater detail below.

The source side of the switch 235 is connected to a germanium type of transistor amplifier 264 in the reference network 46 via a resistor 268, the source side of the switch 235 being more particularly connected to the emitter of the transistor amplifier 264. The emitter of the transistor amplifier 264 is connected to a positive power supply at a terminal 270 via a resistor 272, and a silicon diode 274 is connected between the resistor 272 and the positive power supply 270 and to the base of the transistor amplifier 264.

The base of the transistor amplifier 264, generally between the transistor amplifier 264 and the diode 274 is connected to the collector of a transistor amplifier 276. The base of the transistor amplifier 276 is connected to the collector of the transistor amplifier 226 in the control signal generator 28 and the collector of the transistor amplifier 264 is connected to the collector of the transistor amplifier 226 in the control signal generator 28. The emitter of the transistor amplifier 276 in the reference network 46 is connected to a junction 277 via a conductor 280, the junction 277 being connected to ground and to the emitter of the transistor amplifier 226 of the control signal generator 28. A resistor 278 is interposed in the conductor 280, and a zener type of diode 282 is connected between the base of the transistor amplifier 276 of the reference network 46 and the conductor 280, generally between the resistor 278 and the transistor amplifier 226 of the control signal network 28. The reference network 46 is constructed to receive a control signal from the control signal generator 28 via the connection between the transistor amplifier 226 of the control signal generator 28 and the transistor amplifiers 264 and 276 in the reference network 46, in one aspect of the operation of the indicator apparatus 10, the reference network 46 being constructed to develop a predetermined voltage reference signal in response to a received control signal which is connected to the meter network 44, for reasons and in a manner to be described in greater detail below.

The emitter of the transistor amplifier 276 in the reference network 46 is also connected to a junction 284 and the junction 284 is connected to the base of a transistor amplifier 286 via a resistor 288, the transistor amplifier 286 comprising a portion of the sample indicator 32, as shown in FIG. 1. The emitter of the transistor amplifier 286 is connected to ground, and the collector of the transistor amplifier 286 is connected to a positive power supply at a junction 290, a resistor 292 being interposed between the collector of the transistor amplifier 286 and the junction 290. The collector of the transistor amplifier 286 is connected to the conductor 314 via a conductor 294, the conductor 294 being connected generally between the resistor 292 and the collector of the transistor amplifier 286. A zener type of diode 296 is interposed in the conductor 314, the anode end of the diode 296 being connected to ground and the cathode end of the diode 296 being connected to the junction or connection between the conductor 294 and the conductor 314. The sample indicator 32 cooperates with the meter network 44 to provide an operator-perceivable output indication indicating that the sample voltage has been developed in the peak detector 38, in a manner to be made more apparent below.

The hold network 42 includes the transistor amplifier 218, as mentioned before, and the base of the transistor amplifier 218 is connected to the junction 284 via a conductor 298, and a resistor 300 is interposed in the conductor 298 generally between the transistor amplifier 218 and the junction 284. The collector of the transistor amplifier 218 of the hold network 42 is connected to the junction 176 of the peak detector 38 via a conductor 302, generally between the junction 176 and the diode 216 of the trigger signal generator 40. The emitter of the transistor amplifier 218 in the hold network 42 is connected to the junctions 174 and 196 of the peak detector 38 via a conductor 304, a diode 306 being interposed in the conductor 304, generally between the transistor amplifier 218 of the hold network 42 and the junction 196 of the peak detector 38. A diode 305 is connected to the emitter of the transistor amplifier 218, generally between the transistor amplifier 218 and the diode 306, the diode 305 connecting the junction 176 of the peak detector 38 to ground in an "on" or conducting position of the transistor amplifier 218 to swing the output signal of the operational amplifier 170 in the negative-going direction lowering the voltage level at the junction 176, reverse-biasing the diode 190, thereby preventing further charging of the sample capacitor 184 and cooperatingly preventing the further sampling of subsequent input signals via the peak detector 38 until the indicator apparatus 10 has been reset. The transistor amplifier 218 also functions to drive the junction 174 of the peak detector 38 positive in the conducting or "on" position of the transistor amplifier 218 which further swings the operational amplifier 170 output signal at the junction 176 in the negative direction.

The meter network 44 includes an operational amplifier 308 having the output thereof connected to a meter 310, the meter 310 being more particularly constructed and connnected to the components of the meter network 44 to comprise what is commonly referred to in the art as a "null type meter", as generally mentioned before. The meter 310 is also connected to ground via a resistor 312, as shown in FIG. 1.

The positive input of the operational amplifier 308 is connected to the collector of the transistor amplifier 286 via a conductor 314, the conductor 314 being, more particularly, connected at the junction or connction between the conductor 294 and the cathode end of the diode 296. A capacitor 316 is interposed in the conductor 314 and a resistor 318 is connected to one side of the capacitor 316, the resistor 318 being then connected to ground. A pair of diodes 320 and 322 connected in parallel are interposed between the capacitor 316 and the operational amplifier 308, as shown in FIG. 1. A resistor 324 is connected to the positive input of the operational amplifier 308, generally between the operational amplifier 308 and the diodes 320 and 322, the resistor 324 being connected to ground.

The negative input of the operational amplifier 308 is connected to the junction 284 via a conductor 326 and a variable resistor 328 is interposed in the conductor 326, generally between the operational amplifier 308 and the junction 284. A feedback resistor 330 is connected between the negative input of the operational amplifier 308 and the output thereof, the conductor 200, connecting the junction 198 of the peak detector 38 to the meter network 44, being more particularly connected between the feedback resistor 330 and the negative input of the operational amplifier 308. The cathode end of a diode 332 is connected to the junction between the feedback resistor 330 and the conductor 200, the anode end of the diode 332 being connected to ground.

As mentioned before, the meter 310 is, more particularly, a null type of meter and includes a meter needle, in one preferred form. The meter 310 receives the operational amplifier 308 output signal and the meter needle 334 moving in one direction or in the opposite direction provides one form of operator-perceivable output indication. The nulling of the meter 310 to position the meter needle at a substantially zero or null position, by varying the adjustable resistor 328 to balance the sample signal and the voltage reference signal to a position wherein the operational amplifier 308 output signal nulls the meter needle, provides the operator-perceivable output indication indicative of the input signal.

OPERATION OF FIG. 1

The indicator apparatus 10, shown in FIG. 1, is constructed to provide an operator-perceivable output indication indicative of an input signal. For the purpose of clarity of description, the current through the integrator capacitor 178 is diagrammaticaly shown in FIG. 1 and designated by the reference numeral 338, the current through the switch 180 is diagrammatically shown in FIG. 1 and designated by the reference numeral 340, and a current being drawn generally from the junction 174 is diagrammatically shown in FIG. 1 and designated by the reference number 342, the currents 338, 340 and 342 being referred to below with reference to the operation of indicator apparatus 10.

When the indicator apparatus 10 is initially positioned in the "off" position via moving the switch arms 254 to the "off" switch positions 255, the capacitor 256 connected to and discharged through the positive buss at the terminal 258, the various components and assemblies of the indicator apparatus 10, through the negative buss at the terminal 263, through the diode 262 and resistor 260 to the junction 240. Except for the voltages of the power supply of the indicator apparatus 10 provided via the power suplies 244 and 246, the voltage levels within the control circuit of the indicator apparatus 10 will drop to zero within a relatively short time after the switch 252 is positioned in the "off" position. But for the diode 262, the operator would be required to maintain the switch 252 in the "off" position for a period of time controlled essentially via the time-constant of the capacitor 256 and the resistor 260 before again positioning the switch 252 in the "on" position during the reset operation of the indicator apparatus 10, as will be made more apparent below.

When the switch 252 is initially positioned in the "on" or "reset" position via moving the switch arms 254 to the switch positions 248 and 250, the capacitor 256 of the reset network 34 is charged via the resistor 242 and the field-effect transistor switch 235, the capacitor 256 also being charged via the resistor 260. The capacitor 184 is discharged via the switch 235 to the ground connection at the drain side of the switch 235. The positive power supply at the terminal 270 is connected to ground via the switch 235 causing an increased current flow across the resistor 272 biasing the transistor amplifier 264 of the reference network 46 in the off or non-conducting position, the transistor 276 being biased in the off or non-conducting position and the reference voltage at the junction 284 being substantially zero. The transistor amplifier 224 of the control signal generator 28 is biased in the off or non-conducting position and the transistor amplifier 226 of the control signal generator 28 is biased in the on or conducting position connecting a relatively small positive voltage to the diode 132 of the bias control 36 via the conductor 130, the positive voltage connected to the diode 132 being of an insufficient voltage level to bias the diode 132 in the conducting or closed position, in this position of the indicator apparatus 10.

After the switch 252 is positioned in the "on" or "reset" position, the control circuit of the indicator apparatus 10, shown in FIG. 1, is positioned in the operating position for receiving input signals induced therein via the transducer 12. In this position of the indicator apparatus 10, the capacitor 256 is fully charged and a negative voltage is applied to the gate of the switch 235 opening or positioning the switch 235 in an off position, the diode 236 between the switch 235 and the junction 186 of the peak detector 38 being reversed biased and positioned in the open position. The transistor amplifiers 120 and 122 of the bias control 36 are each biased in the on or conducting position connecting the operating bias voltage to the transistor amplifiers 144 and 146 of the amplifier network 24 via the active differential filter network 22, the output voltage level of the bias control 36 controlling and setting the common mode voltage level biasing the transistor amplifiers 144 and 146 in the on or conducting position.

Further, after the indicator apparatus 10 is positioned in the "on" or "reset" position, the junction 208 is clamped to substantially ground potential via the diode 216 and a relatively small noise current 340 is conducted through the switch 180 of the peak detector 38 holding the output of the operational amplifier 170 at the junction 176 at the initial or first level, which is approximately a negative 0.7 volts in the one operational embodiment, mentioned generally before. The base of the transistor amplifier 218 of the hold network 42 is clamped to substantially ground potential via the negative voltage at the junction 176 of the peak detector 38, the diodes 305 and 306 each being biased in the open or non-conducting position.

In summary, the indicator apparatus 10 is positioned in the reset or on position via positioning the switch arms 254 in the switch positions 248 and 250, thereby discharging the capacitor 184 and positioning the control circuit such that: the amplifier network 24 is biased in the operation position by the bias control 36 connected thereto via the active differential filter network 22; the diode 236 is reverse biased or open; the control signal generator 28 is held in the reset or on position wherein the transistor amplifier 224 is biased in the off or non-conducting position and the transistor amplifier 226 is biased in the on or conducting position; the peak detector 38 having sampled during the transient period of reset relatively low level noise signals in the input circuit of the indicator apparatus 10 by charging the capacitor 184, the current 340 representing or indicating the sampled noise current; the sampled noise current causes a voltage drop at the diode 194 establishing the initial, first level of voltage at the junction 176; and the capacitor 256 of the reset network 34 is fully charged and the switch 235 is positioned in the open position. In this position, the indicator apparatus 10 is positioned to receive, sample and display input signals.

The induced input signal from the transducer 12 is connected to the control circuit of the indicator apparatus 10 at the input junctions 86 and 88, the input signal being connected to the amplifier network 24 via the low pass filter network 20 and the active differential filter network 22, as described before. The input signal is amplified via the amplifier network 24 and connected to the peak detector 38 via the conductor 162.

The amplifier network 24 output signal is, more particularly, connected to the junction 174 of the peak detector 38 and to the negative input of the operational amplifier 170 of the peak detector 38. The operational amplifier 170 inverts the amplifier network 24 output signal, thereby swinging the output of the operational amplifer 170 at the junction 176 in a positive-going direction, the operational amplifier 170 and the integrator capcitor 178 integrating the operational amplifier 154 output signal.

As previously mentioned, the peak detector 38 receives and integrates some relatively low amplitude noise signals prior to sampling and the noise signals appear at the junction 176 of the delay and sample network 26 establishing the first, initial predetermined voltage level of the delay and sample network 26, the initial predetermined voltage level being of an insufficient value to activate trigger signal generator 40. The amplified, induced input signal of the indicator apparatus 10 is integrated via the delay and sample network 26 and the integrated input signal appears at the junction 176 of peak detector 38 raising the voltage level generally from the initial predetermined level toward the second predetermined level sufficient to activate the trigger signal generator 40, as will be described in greater detail below.

Thus, when the indicator apparatus 10 initially starts receiving the induced input signals, the input signal and the noise signal (sometimes referred to herein as the "first signal") are each integrated via the peak detector 38 and the integrated signal appears at the junction 176, the integration of the signals being generally expressed algebraically as follows for the purpose of clarity of description:

$$(I_{342} - I_{340})dt \qquad (1)$$

wherein:

$I_{340}$ = represents the value of current through the switch 180, the current being more particularly produced by the noise signal, in this instance;

$I_{342}$ = represents the value of the current drawn generally from the junction 174 as a result of the induced input signal.

In this position of the indicator apparatus 10 initially receiving an induced input signal, the voltage across the sample resistor 192 (between the junctions 196 and 198) is substantially zero, the capacitor 178 of the peak detector 38 is being charged via the current 338 and the capacitor 202 connected to the negative input of the operational amplifier 206 is being charged. If the input signal is not of a sufficient strength for a predetermined duration to shift the integrated input signal at the junction 176 to the predetermined minimum value, the indicator apparatus 10 will not be positioned in a sampled position, the diode 222 connected to the control signal generator 28 remaining in a reversed bias position.

Assuming the induced input signal is of a sufficient strength to raise or shift the voltage level at the junction 176 from the initial predetermined level to the predetermined minimum level to cause the indicator apparatus 10 to be positioned in the sampled position, the induced input signal amplified via the amplifier network 24 is integrated via the peak detector 38, the integrated input signal appearing at the junction 176 in a manner similar to that described before. The output signal of the operational amplifier 170 thus swings in the positive-going direction and the capacitors 178 and 202 each begin charging. As the voltage level at the junction 176 continues to rise, the capacitor 178 continues to charge and the sample capacitor 184 will begin to charge (in most instances) when the voltage level at the junction 176 is of a sufficient level to forward bias the diode 190, the charging of the sample capacitor 184 biasing the switch 180 in the closed or conducting position increasing the current 340. Also, as the integrated input signal continues to swing the voltage level at the junction 176 in the positive-going direction, the current through the switch 180 will continue to increase as the charge on the sample capacitor 184 is increased, and the current through the integrator capacitor 178 will generally decrease as the voltage level at the junction 176 approaches the predetermined minimum level for positioning the indicator apparatus 10 in the sampled position.

The peak detector 38 is constructed such that, when the current represented by the directional arrow 340 is substantially equal to the current being drawn from the peak detector 38 represented by the directional arrow 342, the slope of the integrated input signal at the junction 176 is substantially zero since the current 338 is equal to the capacitance of the integrator capacitor 178 multiplied by the rate-of-change of the voltage level at the junction 176 with respect to time and, if the rate-of-chage of the voltage level at the junction 176 is substantially equal to zero, then the current 338 is substantially equal to zero. In this position of the delay and sample network 26, the voltage level at the junction 176 is at the predetermined minimum voltage level (the second predetermined level) sufficient to cause the generation of the trigger signal and the control signal for positioning the indicator apparatus 10 in the sampled position.

The trigger signal generator 40 receives the signal at the junction 176 or, more particularly, at the junction 188, and is constructed to switch ouput state thereof when the slope of the signal at the junctions 176 and 188 is substantially zero or, in other words, when the peak detector 38 voltage level of the output signal at the junctions 176 and 178 has switched from the first, initial predetermined level to the second, predetermined minimum level. In response to the received output signal from the peak detector 38 of the predetermined minimum level, the output signal of the operational amplifier 206 at the junction 208 switches to the "high" state or, in other words, the trigger signal generator 40 generates and produces the output trigger signal. The trigger signal is connected to the base of the transistor amplifier 224 and to the collector of the transistor amplifier 226 via the resistor 228, thereby biasing the control signal generator 28 to a position wherein the transistor amplifier 224 is biasingly switched to the "on" or conducting position and the transistor amplifier 226 is in the "off" or non-conducting position, the control signal generator 28 remaining in this position until the indicator apparatus 10 is reset via the reset network 34 in a manner described before.

Immediately prior to the generation of the trigger signal via the trigger signal generator 40, the transistor amplifier 276 is biased in the "off" or non-conducting position and the voltage level at the junction 284 of the reference network 46 is substantially zero, the transistor amplifier 218 of the hold network 42 being biased in the "off" or non-conducting position. After the trigger signal has been generated via the trigger signal generator 40, the transistor amplifiers 264 and 276 are each biased in the "on" or conducting position thereby developing and producing a predetermined reference voltage level at the junction 284 of the reference network 46. The reference voltage at the junction 284 is connected to the base of the transistor amplifier 218 of the hold network 42 biasing the transistor amplifier 218 in the "on" or conducting state.

The transistor amplifier 286 of the sample network 32 is biased in the "on" or conducting position, discharging the capacitor 316, previously charged via the connection thereof to the positive power supply at the terminal 290. The discharging of the capacitor 316 causes a signal input at the positive or noninverting input of the operational amplifier 308 thereby causing the meter needle 334 to be moved indicating that the sample signal has been developed in the peak detector 38, the capacitor 316 being subsequently recharged.

When the trigger signal is generated via the trigger signal generator 40 and the control signal is generated via the control signal generator 28, the transistor amplifier 218 of the hold network 42 is thus biased in the "on" or conducting position connecting the operational amplifier 170 output signal at the junction 176 to ground via the diode 305 and conducting a positive signal to the input of the operational amplifier 170 at the junction 174 causing the output signal of the operational amplifier 170 at the junction 176 to further swing in the negative-going direction. Since the negative-going swing at the junction 176 occurs immediately after the slope of the signal at the junction 176 goes to substantially zero, the sample capacitor 184 is thus substantially blocked from further charging, the diode 190 being reverse biased or open. The negative-going swing at the junction 176 is continued until the current through the resistor 300 goes through the collector of the transistor amplifier 218 in the nature of a forward biased diode, the current through the diodes 305 and 306 of the hold network 42 going to substantially zero. The amplifier network 24 is biased in the "off" position via the bias control 36 and the current 342 goes to substantially zero, the current 338 being substantially zero during this stage of the operation of the indicator apparatus 10, after a transient period of time. Thus, the current 340 will go through th sample resistor 192 developing a voltage drop thereacross equal to the developed sample signal. In this position of the indicator apparatus 10 should the voltage level at the junction 176 tend to move in the positive-going direction charging the sample capacitor 184, the hold network 42 acts to draw current from the junction 176 and conduct the positive hold or blocking signal to the junction 174 at the negative or inverting input of the operational amplifier 170, thereby lowering the voltage level at the junction 176 and effectively clamping the junction 176 at a voltage level sufficiently low to substantially prevent further charging of the sample capacitor 184. The transistor amplifier 218 thus provides a clamping action blocking the receiving and sampling of subsequently induced input signals via the peak detector 38. Thus, after the transient period of time, the current 338 through the integrator capacitor 178 is substantially zero and the sample capacitor 184 remains charged continuing to bias the switch 180 closed to produce the current 340 for developing the sample signal across the sample resistor 192.

The sample signal across the resistor 192 is connected to the meter network 44 and the adjusting of the variable resistor 328 to null the meter 310 provides the output indication indicative of the input signal. The indicator apparatus 10 provides an operator-perceivable output indication via the meter 310 indicating that the trigger signal and the control signal have been generated to initiate the positioning of the indicator apparatus 10 in the sampled position via the discharging of the capacitor 316 to cause the meter needle 334 to swing to the left of the null position.

After the meter network 44 has been adjusted to provide the output indication indicative of the input signal the operator can re-position or reset the indicator apparatus 10 for receiving and sampling additional, subsequently induced input signals via the reset network 34. The switch 252 is first moved to the "off" position by moving the switch arms 254 to the off switch positions 255. The opening of the switch 254 discharges the capacitor 256 through the positive buss at the terminal 258, the various components of the control circuit of the indicator apparatus 10, and the diode 262 to ground. The indicator apparatus 10 is then turned on via moving the switch arms 254 to the on or reset switch positions 248 and 250, thereby positioning the switch 254 in the on or conducting position and discharging the sample capacitor 184 through the switch 235. The positioning of the switch 235 in the conducting position pulls the potential at the emitter of the transistor amplifier 264 down, thereby reverse biasing the transistor amplifier 264 causing the control signal generator 28 to be reset to a position wherein the transistor amplifier 226 is conducting and the transistor amplifier 224 is non-conducting. The capacitor 316 is charged to provide the operator-perceivable output indication indicating the indicator apparatus 10 has been reset for receiving subsequently induced input signals in a manner described before.

EMBODIMENT OF FIG. 2

Shown in FIG. 2 is a partial, schematic view of a modified indicator apparatus 10a constructed similar to the indicator apparatus 10 described before and schematically shown in FIG. 1, only those portions of the control circuit of the indicator apparatus 10a considered necessary to illustrate the differences shown in FIG. 2 for the purpose of clarity of description. The indicator apparatus 10a includes a modified amplifier network 24a, a modified control signal generator 28a, a modified reset network 34a, a modified bias control 36a, a modified trigger signal generator 40a, a modified hold network 42a, a modified meter network 44a and a modified reference network 46a. In adddition, the conductor 118 from the positive or noninverting input of the operational amplifier 116 (see FIG. 1) in the active differential filter network 22 is connected to ground.

The modified amplifier network 24a includes a bias transistor amplifier 334, the emitter of which is connected to ground and the collector of which is connected to the base thereof. In addition, the bases of transistor amplifiers 144 and 146 are connected to the base of the transistor amplifier 334 and to the modified bias control 36a via a connector 336.

The modified trigger signal generator 40a has the resistor 210 connected between the junction 208 and the source connection of the switch 235, and has a diode 338 connected between the junction 208 and the output of the operational amplifier 206.

The modified reset network 34a is connected to the modified reference network 46a via a signal path 340 from the junction 240. In addition, the resistor 268 is connected between the positive buss for the indicator apparatus 10a at a terminal 342 and the source connection of the switch 235.

The modified meter network 44a includes a capacitor 344 connected in parallel to the resistor 330 between the inverting input of the operational amplifier 308 and the output thereof. In addition, a resistor 346 is positioned between the inverting input of the operational amplifier 308 and the junction 348. Finally, the conductor 314 is connected to the modified bias control 36a in a manner to be made more apparent below.

In the modified control signal generator 28a, the transistor amplifier 226 and the resistor 234 have been eliminated. Instead, the modified control signal generator 28a has the base of the transistor amplifier 224 connected to ground via a resistor 348. In addition, the collector of the transistor amplifier 224 has been connected to the modified hold network 42a via the signal path 298. Finally, a capacitor 350 has been connected in parallel with the resistor 230 between the collector of the transistor amplifier 224 of the modified control signal generator 28a and the base of the transistor amplifier 264 in the modified reference network 46a.

In the modified bias control 36a, the base of a transistor amplifier 352 is connected to the positive buss via a resistor 354 and the terminal 124. The base of the transistor amplifier 352 is also connected to ground via a resistor 356 connected in parallel with a capacitor 358. The emitter of the transistor amplifier 352 is connected to the emitter of the transistor amplifier 264 of the modified reference network 46a via the signal path 130. The collector of the transistor amplifier 352 is connected to the capacitor 316 of the modified meter network 44a via the signal path 314. In addition, the collector of the transistor amplifier 352 is connected to the modified amplifier network 24a via a resistor 360 and the signal path 336.

In the modified reference network 46a, the base of the transistor amplifier 264 is connected to the modified reset network 34a via a diode 362 and the signal path 340. The base of the transistor amplifier 264 is also connected to the positive buss via a resistor 364 and the terminal 270. The collector of the transistor amplifier 264 is connected to the base of the transistor amplifier 224 in the modified control signal generator 28a via a thermistor 366 and the resistor 228. The collector of the transistor amplifier 264 is also connected to the base of the transistor amplifier 276. The collector of the transistor amplifier 276 is connected to the positive buss via the terminal 368 while the emitter thereof is connected to the modified meter network 44a via the signal path 326 and to ground via the variable resistor 370. In the preferred embodiment, the variable resistor 370 is gang-connected to the variable resistor 328 so that the sum of the resistances of variable resistors 328 and 370 remains substantially constant.

The modified reference network 46a has included as a portion thereof a constant current source 372. The constant current source 372 consists primarily of the transistor amplifier 374. The base of the transistor amplifier 374 is connected to the positive buss via diodes 376 and 378 and the terminal 270. The base of the transistor amplifier 374 is also connected to the negative buss via the resistor 380 and the terminal 382. The emitter of the transistor amplifier 374 is also connected to the positive buss via the resistor 384 and the terminal 270. The collector of the transistor amplifier 374 is connected to the emitter of the transistor amplifier 264 and to the emitter of the transistor amplifier 352 of the modified bias control 36a via the signal path 130.

In the modified hold network 42a, the resistor 300 and the diode 306 have been eliminated and the transistor amplifier changed to a P-N-P type of semiconductor device. The modified hold network 42a will operate in substantially the same manner as the hold network 42 described above in relation to the indicator apparatus 10.

The indicator apparatus 10a includes in addition to the modified circuits described above, a sensitivity control 386. The sensitivity control 386 connects the positive buss to the signal path 304 via the terminal 388, a switch 390 and a resistor 392. The sensitivity control 386, which may be used independently of the other modified networks shown in FIG. 2, operates to upwardly bias the peak detector 38 when the switch 390 is closed. In other words, the sensitivity control 386 operates to adjust the level of current 340 to make the peak detector 38 less sensitive to minor movements of the transducer 12, but does not affect the accuracy of the indicator apparatus 10a.

The indicator apparatus 10a will operate similar to the indicator apparatus 10, described before. When the indicator apparatus 10a is initially switched to the on or reset position by moving the switch arms 254 to the on switch positions 248 and 250, the sample capacitor 184 (see FIG. 1) of the peak detector 38 is discharged to ground via the switch 235, in a manner like that described before with respect to the indicator apparatus 10. In addition, the transistor amplifier 264 is biased in the off or non-conducting position via the diode 362. Since the transistor amplifier 264 is biased in the off or non-conducting position, the current supplied by the transistor amplifier 374 of the constant current source 372 is routed to the transistor amplifier 352 of the modified bias control 36a via the signal path 130. As a result, the transistor amplifier 352 is biased in the on or conducting position, thereby connecting the operational bias voltage to the transistor amplifiers 144 and 146 of the modified amplifier network 24a via the resistor 360, the signal path 336 and the biasing amplifier 334. As described above, the output voltage level of the modified bias control 36a controls and sets the common mode voltage level biasing the transistor amplifiers 144 and 146 in the on or conducting position. In addition, the capacitor 316 in the modified output indicator 44a is charged via the signal path 314 to provide the operator-perceivable output indication indicating the indicator apparatus 10a has been reset for receiving induced input signals.

After the indicator apparatus 10a has been reset or at the end of the reset portion of the operation of the indicator apparatus 10a, the switch 235 and the transistor amplifiers 264 and 224 are each biased in the off or non-conducting position and the diodes 222 and 236 are each reversed biased or open. In addition, the transistor amplifier 352 is biased in the on or conducting position by the positive power supply connected thereto via the terminal 124 and the resistor 354.

When an input signal is induced in the control circuit of the indicator apparatus 10a via the transducer 12 and initially received by the delay and sample network 26a, the peak detector 38 will begin integrating the received modified amplifier network 24a output signal, thereby swinging the voltage level on the signal paths 200 and 302 in the positive-going direction. Initially the integrated signal connected to the inverting input of the operational amplifier 206 via the signal path 200 is not of a sufficient level to switch the state of the operational amplifier 206 from a low to a high state for generating the trigger signal. Thus, the transistor amplifier 224 is biased in the off or non-conducting position so that the modified hold network 42a is in the off position.

As the voltage level on the signal path 200 continues to swing in the positive-going direction to a level less than the second predetermined level, the operational amplifier 206 output signal will swing towards the positive biasing-cut-off point of the diode 338. However, assuming the voltage level on the signal path 200 does not rise to the second predetermined level activating the control circuit of the indicator apparatus 10a to sample the induced input signal, the diode 338 will remain biased in the on or conducting position.

When the integrated signal on the signal path 200 from the peak detector 38 initially reaches the second predetermined level, the diodes 216 and 338 are each biased in the off or non-conducting position thereby causing the modified trigger signal generator 40a to apply the trigger signal to the modified control signal generator 28a via the signal path 220. In response to the trigger signal, the diode 222 and the transistor amplifier 224 of the modified control signal generator 28a will be biased in the on or conducting position thereby actuating the hold network 42a via the signal path 298 in a manner described generally above in relation to the indicator apparatus 10. In addition, the control signal is produced by the modified control signal generator 28a via the resistors 228 and 230 and the capacitor 350 for application to the modified reference network 46a.

In response to the application of the control signal, the transistor amplifier 276 is biased in the on or conducting position thereby producing the reference signal via the signal path 326 for application to the modified meter network 44a. In addition, the transistor amplifier 264 is biased in the on or conducting position thereby drawing a substantial proportion of the current supplied by the constant current source 372 thereby biasing the transistor amplifier 352 of the modified bias control 36a in the off or non-conducting position.

As a result of the transistor amplifier 352 being biased in the off or non-conducting position, the transistor amplifiers 144, 146 and 334 are biased in the off or non-conducting position and the capacitor 316 of the modified meter network 44a is allowed to discharge through the resistor 360 and the biasing transistor amplifier 334 of the modified amplifier network 24a. The discharging of the capacitor 316 causes the modified meter network 44a to produce a transient output indication indicating that the sample signal has been developed in the peak detector 38 in a manner described above in relation to the indicator apparatus 10. Thereafter, the modified indicator apparatus 10a is positioned in the sample position when the sample signal is provided by the peak detector 38 for application to the modified meter network 44a via the signal path 200 and the resistor 202. In response to the sample signal, the modified meter network 44a will develop operator-perceivable output indications indicative of the sample signal in a manner similar to that described before with respect to the indicator apparatus 10.

It should be noted that various preferred embodiments of a transducer suitable for operation in connection with the present invention are disclosed in the Applicant's copending application entitled "Indicator Apparatus for Developing Output Indications Indicative of Input Signals", Ser. No. 421,025, filed on Dec. 3, 1973 which was a continuation-in-part of the Applicant's then copending application entitled "Apparatus for Providing Output Indications Responsive to the Movement of a Moving Body", Ser. No. 294,380, filed on Dec. 2, 1972, now U.S. Pat. No. 3,818,341.

Changes may be made in the construction and the arrangement of the parts or the elements of the various embodiments as disclosed herein without departing from the spirit and the scope of the invention as defined in the following claims.

What is claimed is:

1. An active differential filter network receiving an input signal and a bias control signal and providing an output signal, comprising:
   bridge network means having a pair of input-output junctions and a pair of control junctions, the input signal and an output signal being connected to the input-output junctions;
   operational amplifier means having an inverting and a non-inverting input and an output, the inverting input being connected to one of the control junctions and the output being connected to the other control junction of the bridge network means, the bias control signal being connected to the non-inverting input of the operational amplifier means.

2. The active differential filter network of claim 1 wherein the bridge network means is further defined to include:
   first impedance means connected between one of the input-output junctions and one of the control junctions;
   second impedance means connected between the one input-output junction and the other control junction;
   third impedance means connected between the other input-output junction and the one control junction; and
   fourth impedance means connected between the other input-output junction and the other control junction.

3. The active differential filter network of claim 2 wherein each of the impedance means is a resistor.

* * * * *

UNITED STATES PATENT OFFICE
CERTIFICATE OF CORRECTION

Patent No. 4,020,424    Dated April 26, 1977

Inventor(s) Neal M. Burdick

It is certified that error appears in the above-identified patent and that said Letters Patent are hereby corrected as shown below:

Column 4, line 59, "filter network" should be --apparatus--.

Column 7, line 44, after the word "described" the words --before and in a manner to be described-- should be inserted.

Signed and Sealed this nineteenth Day of July 1977

[SEAL]

Attest:

RUTH C. MASON
Attesting Officer

C. MARSHALL DANN
Commissioner of Patents and Trademarks